United States Patent
Chen

(10) Patent No.: US 6,919,510 B1
(45) Date of Patent: Jul. 19, 2005

(54) WATERPROOF COVER FOR AN AUDIO SYSTEM

(76) Inventor: Ting-Pang Chen, No. 46, Lane 69, Sec. 2, Chienkuo S. Rd., Taipei (TW)

( * ) Notice: Subject to any disclaimer, the term of this patent is extended or adjusted under 35 U.S.C. 154(b) by 0 days.

(21) Appl. No.: 10/916,526

(22) Filed: Aug. 12, 2004

(51) Int. Cl.$^7$ ................................................ H02G 3/14
(52) U.S. Cl. .......................... 174/66; 174/67; 174/50; 174/17 CT; 220/241; 220/242; 220/3.8
(58) Field of Search .............................. 174/66, 67, 50, 174/17 R, 48, 17 CT; 220/3.2, 3.3, 3.5, 3.8, 4.02, 241, 242; 361/600; 16/260, 334; 312/7.1; D13/156

(56) References Cited

U.S. PATENT DOCUMENTS

| | | | | |
|---|---|---|---|---|
| 4,381,063 A | * | 4/1983 | Leong ........................... | 174/67 |
| 4,390,114 A | * | 6/1983 | Sviatoslavsky et al. .... | 220/4.02 |
| 4,500,008 A | * | 2/1985 | Cook ........................... | 220/242 |
| 5,255,965 A | | 10/1993 | Chen et al. | |
| 5,533,637 A | * | 7/1996 | Williams, Jr. ................. | 220/3.8 |
| 5,845,803 A | * | 12/1998 | Saito et al. .................. | 220/241 |
| 5,924,782 A | * | 7/1999 | Park ............................ | 220/242 |
| 6,133,531 A | * | 10/2000 | Hayduke et al. ............... | 174/67 |
| 6,512,178 B2 | * | 1/2003 | Goodman ..................... | 174/66 |
| 6,797,884 B2 | * | 9/2004 | Kubota ......................... | 174/66 |

* cited by examiner

Primary Examiner—Dean A. Reichard
Assistant Examiner—Angel R. Estrada
(74) Attorney, Agent, or Firm—Hershkovitz & Associates; Abe Hershkovitz

(57) ABSTRACT

A waterproof cover for an audio system includes a frame with a top side, a front side and an opening. A slot is defined in the top side of the frame and has two opposite walls. Two apertures are respectively defined through the opposite walls of the slot. Two chambers are defined respectively two ends of the slot and communicate with the slot by the apertures. Two inclined channels are defined in the front side of the fame and communicate with the slot. Two pin assemblies are provided respectively in the chambers and extend out from the apertures. A shield is pivotally mounted on the frame by the pin assemblies and has an inner side and a recessed lip formed in the inner side of the shield in the inclined channels. A gasket is mounted inside the recessed lip of the shield. Accordingly, water cannot penetrate into the waterproof cover, and the audio system remains unaffected by rain, etc.

7 Claims, 4 Drawing Sheets

WATERPROOF COVER FOR AN AUDIO SYSTEM

BACKGROUND OF THE INVENTION

1. Field of the Invention

The present invention relates to a waterproof cover, and more particularly to a waterproof cover for protecting an audio system from water.

2. Description of Related Art

In outdoor activities, an audio system including items such as a loudspeaker, a CD player or a radio for reproducing music is a requirement. However, the audio system will often be affected by water in some situations such as boats, leisure spas etc. Therefore, the audio system is generally provided with a waterproof cover mounted in front of a control panel.

With reference to FIG. 4, a conventional waterproof cover has an inner gasket (50), a frame (60), an outer gasket (70), and a shield (80).

The inner gasket (50) is mounted at a first side of the frame (60) and has a first opening (51) defined therethrough. The frame (60) has a second opening (61) defined therethrough and corresponding to the first opening (51). A slot (62) is defined at an upper side of the frame (60). Two recesses (63) are defined at two ends of the slot (62), and two apertures (64) are respectively defined through the recesses (63).

The outer gasket (70) is mounted at a second side of the frame (60). The shield (80) has a tongue (81) protruded from a rear side thereof. Two lugs (82) are formed at two ends of the tongue (81) and positioned in the apertures (64) through the recesses (63) respectively. Therefore, the shield (80) is pivotally mounted on the frame (60).

In use, the waterproof cover is installed in front of the control panel of the audio system. Blocked by the inner gasket (50) and the outer gasket (70), water cannot dampen the control panel, and the audio system is protected.

However, limited by the manufacturing technology, the shield (80), the outer gasket (70) and the frame (60) can not be tightly assembled together and gaps exist between the shield (80) and the outer gasket (70), and between the outer gasket (70) and the frame (60), so water can penetrate the gaps and the audio system may be seriously damaged by the water.

Therefore, the invention provides a waterproof cover to mitigate or obviate the aforementioned problems.

SUMMARY OF THE INVENTION

The main objective of the present invention is to provide a waterproof cover for an audio system which has a good waterproof effect to completely prevent water from dampening the audio system.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
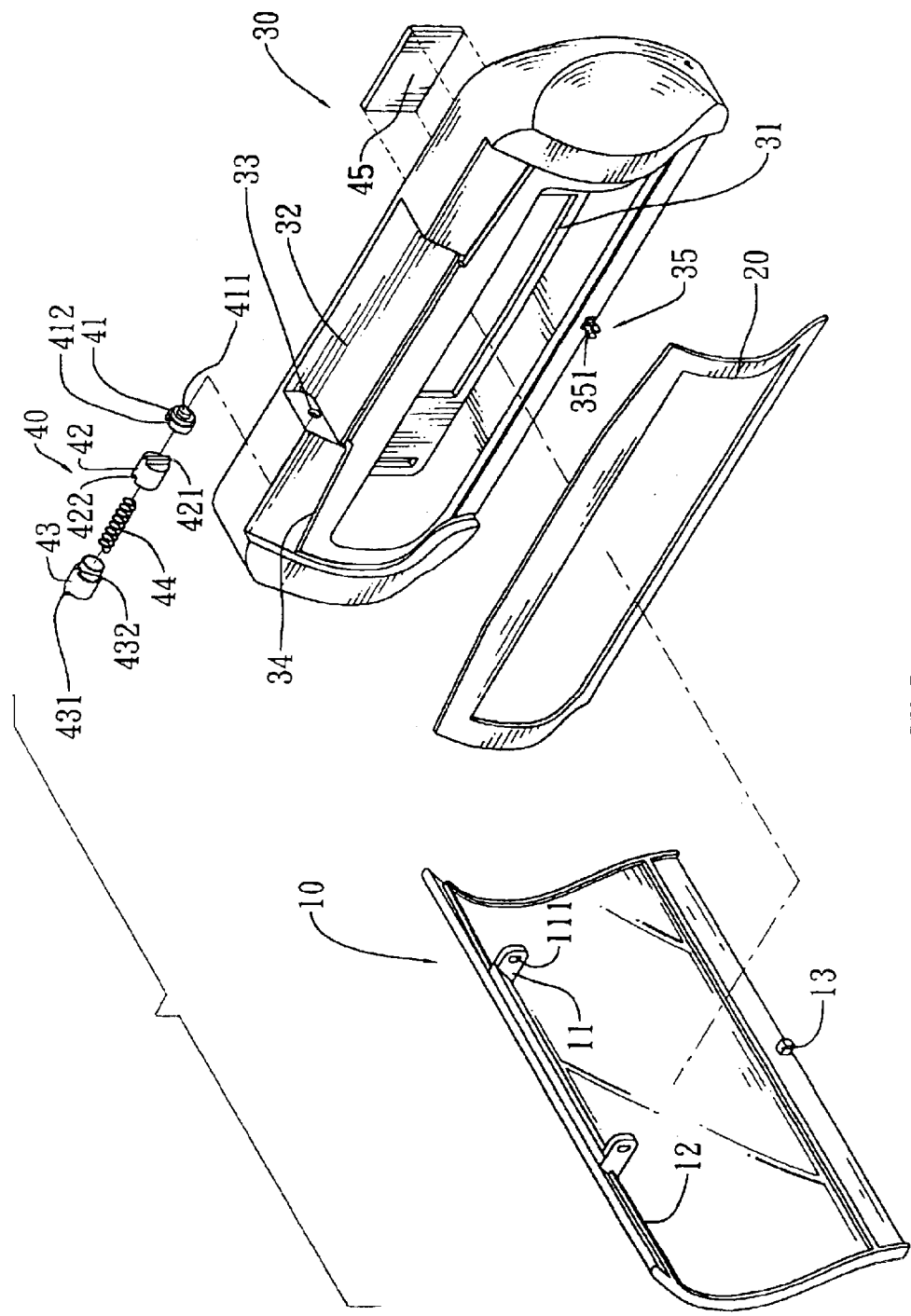
FIG. 1 is an exploded perspective view of a waterproof cover for an audio system in accordance with the present invention.
Figure 2:
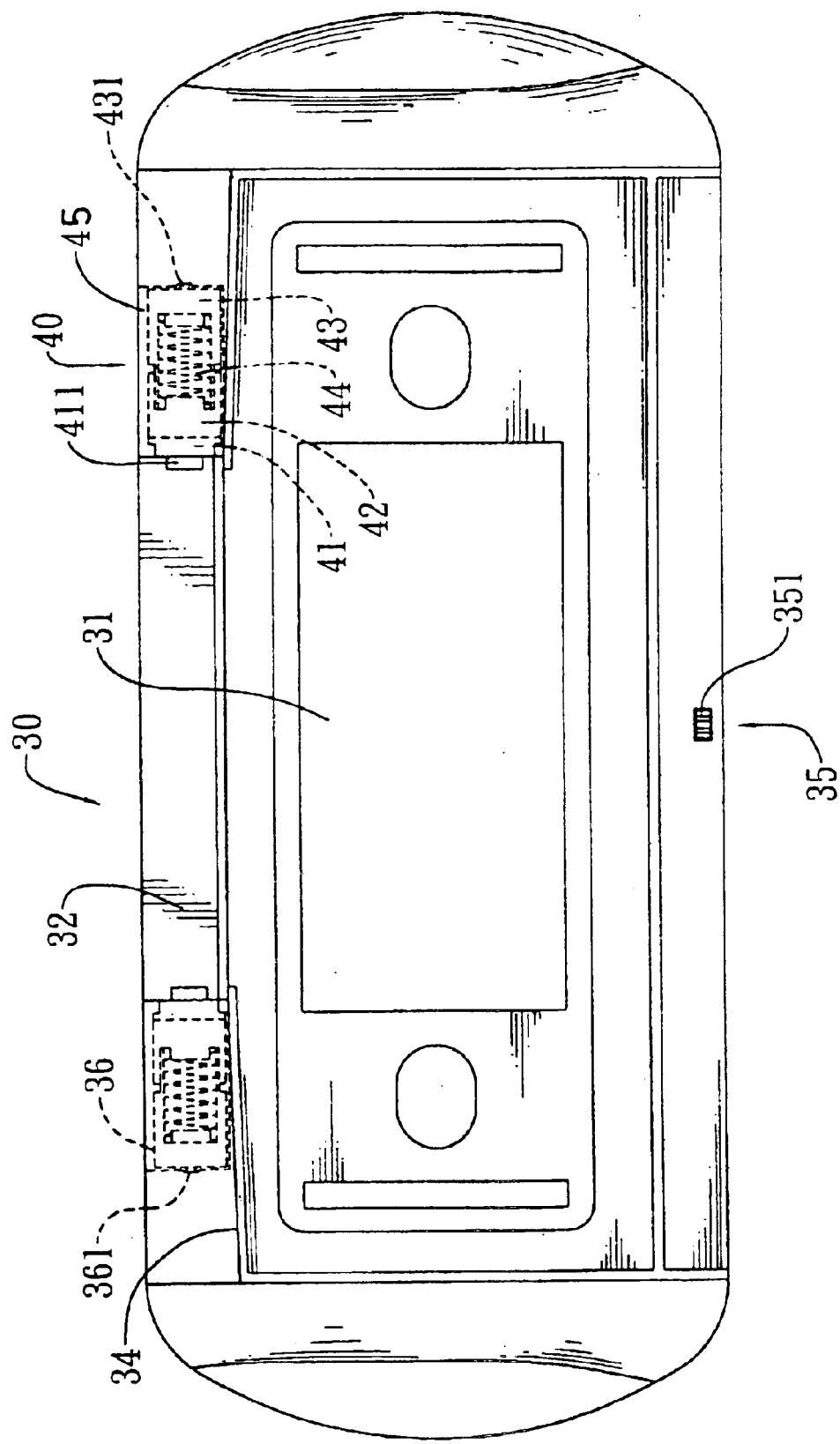
FIG. 2 is a front view of the waterproof cover in accordance with the present invention.
Figure 3:
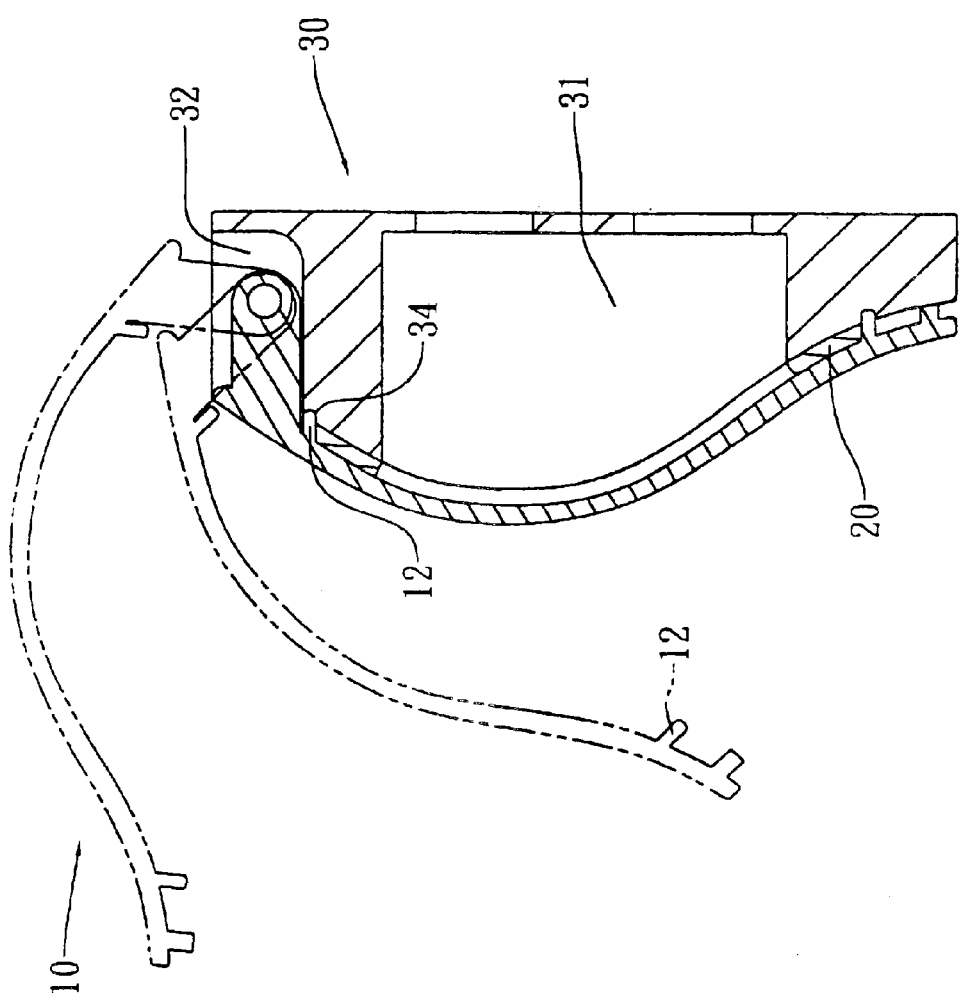
FIG. 3 is a side view of the waterproof cover.
Figure 4:
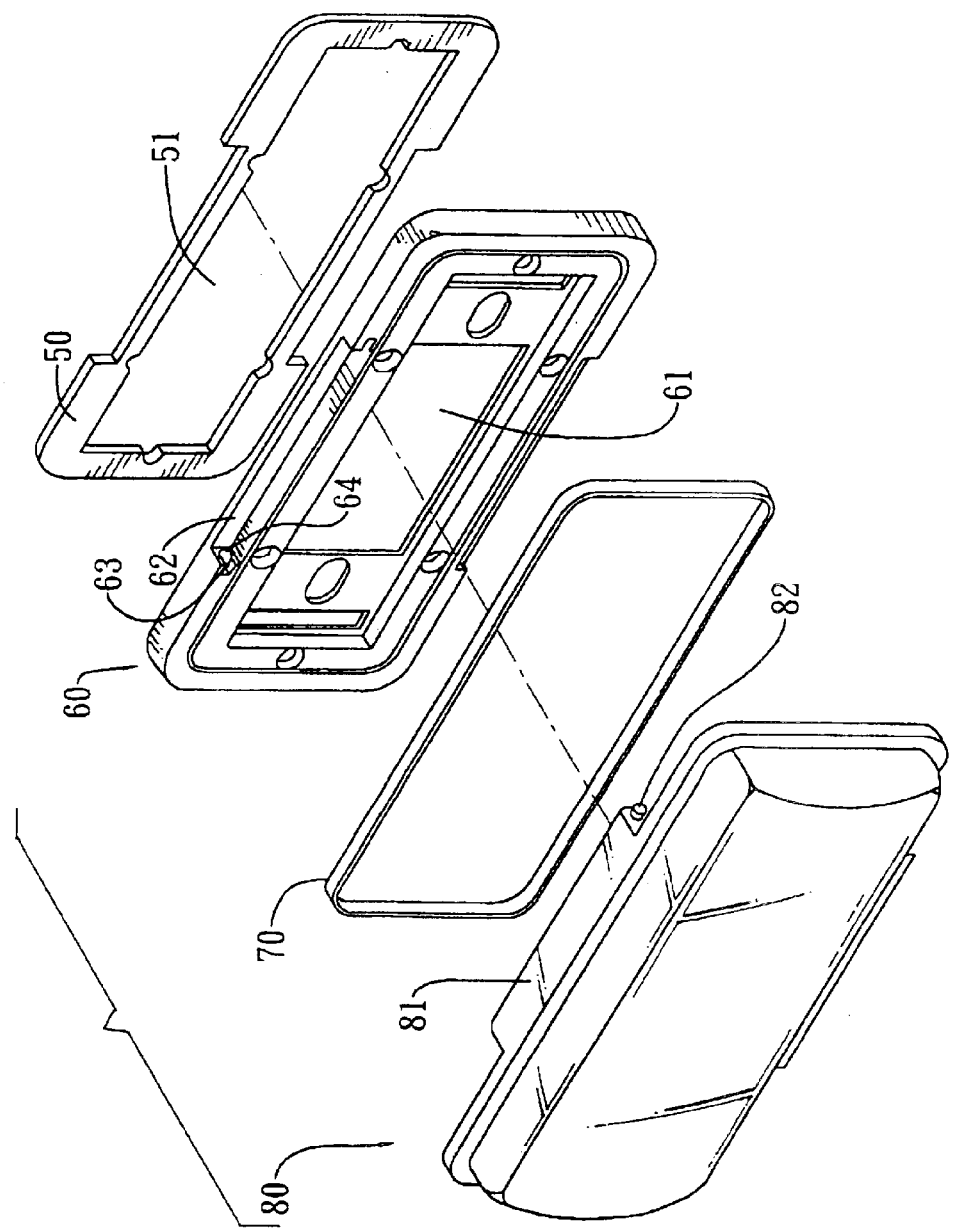
FIG. 4 is an exploded perspective view of a conventional waterproof cover.

With reference to FIGS. 1–3, a waterproof cover is composed of a shield (10), a gasket (20), a frame (30) and a pair of pivot pin assemblies (40). The frame (30) can be installed on the front of a control panel of an audio system including items such as a loudspeaker, a CD player or a radio (not shown) and has a top side, a front side, a lower side, a rear side, an opening (31), a slot (32), two apertures (33), two inclined channels (34) and a clip (35). The opening (31) is defined through the frame (30). The slot (32) is defined at the top side of the frame (30) and has two ends. The apertures (33) are defined respectively at the ends of the slot (32). The inclined channels (34) extend downward, are defined at the front side of the frame (30), communicate with the slot (32) have a width. The clip (35) is provided at the lower side of the frame (30) and has a shell, an Y-like fastener (351) and a resilient member. The shell is installed in the frame (30), and the Y-like fastener (351) and the resilient member are received in the shell. The Y-like fastener (351) is pushed by the resilient member to extend from the shell.

With reference to FIG. 2, the chambers (36) are defined respectively at the ends of the slot (32) and communicate respectively with the apertures (33). Each of the chambers (36) has an inner wall and a recess (361) defined in the inner wall opposite to the corresponding aperture (33). The pivot pin assemblies (40) are mounted respectively and symmetrically in the chambers (36).

Each pivot pin assembly (40) has a first barrel (42), a second barrel (43), a resilient member (44) and a pin (41). The first barrel (42) has a first end, a second end, a first rib (421) and a first groove (422). The first rib (421) is formed at the first end and faces the corresponding aperture (33), and the first groove (422) is defined at the second end. The second barrel (43) has a first end, a second end, a protrusion (432) and a second rib (431). The protrusion (432) is formed at the first end and faces the aperture (33), and the second rib (431) is formed at the second end. The second rib (431) is received in the corresponding recess (361). The resilient member (44) has two ends fastened respectively in the first barrel (42) and the second barrel (43). In assembly, the protrusion (432) is positioned in the first groove (422) to engage the first barrel (42) with the second barrel (43) and to twist the resilient member (44) before the barrels (42, 43) are received in the chamber (36).

The pin (41) extends through the corresponding aperture (33), faces the first barrel (42) and engages with the first rib (421) and has an end, a lug (411) and a second groove (412) defined at the end of the pin (41). After the barrels (42, 43) and the pin (41) are positioned in the chamber (36), the protrusion (432) is removed from the second groove (412) to disengage the first barrel (42) from the second barrel (43).

Two boards (45) are mounted on the rear side of the frame (30) to respectively close the chambers (36). Thus, even if water penetrates into the chambers (36) through the apertures (33), the water is sealed in the chambers (36) by the boards (45) and will not dampen the audio system behind the frame (30).

The shield (10) has an inner side, a lower side, a pair of ears (11), a recessed lip (12) and a block (13). The pair of ears (11) are located in the slot (32), and each ear (11) with a hole (111) aligned with the apertures (33). The lugs (411) extend respectively through the holes (111) to pivotally mount the shield (10) on the frame (30). The recessed lip (12) is formed on the inner side of the shield (10), corresponds to the inclined channels (34) and has a width. The width of the recessed lip (12) is slightly smaller than the width of the inclined channels (34) to define flow passages in the channels (34).

The block (13) is formed on the lower side of the shield (10) and can be positioned in the Y-like fastener (351).

The gasket (20) is provided inside the recessed lip (12) of the shield (10).

When the shield (10) abuts the frames (30) and the block (13) is fastened in the Y-like fastener (351), the shield (10) is positioned on the frame (30) and will not be freely pivoted upwards. The recessed lip (12) is located in the channels (34) and the gasket (20) tightly abuts the front side of the frame (30). Thus, no clearance is between the shield (10) and the frame (30). Even if water penetrates into the frame (30) through the slot (32), the water will be discharged out along the inclined channels (34).

When the block (13) is fastened in the Y-like fastener (351), the resilient members (44) are twisted to provide a force to push the shield (10) upwards. When the block (13) is released from the clip (35), the shield (10) is turned upwards under the force of the resilient members (44), as shown in FIG. 3. Therefore, the control panel of the audio system is accessible through the opening (31).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A waterproof cover for an audio system comprising:
    a frame having a top side, a front side and an opening, a slot defined at the top side of the frame and having two opposite walls and two ends, two apertures defined respectively through the opposite walls of the slot, two chambers defined respectively at two ends of the slot and communicating with the slot through the apertures, and two inclined channels defined at a front side of the frame and communicating with the slot;
    a pair of pin assemblies provided respectively in the chambers and extending out from the apertures;
    a shield pivotally mounted on the frame by the pin assemblies and having an inner side and a recessed lip formed at the inner side of the shield and located in the inclined channels; and
    a gasket mounted inside the recessed lip of the shield.

2. The waterproof cover as claimed in claim 1, wherein
    each of the chambers has an inner wall and a recess defined in the inner wall opposite to the corresponding apertures, and
    each of the pin assemblies has
        a first barrel having a first end, a second end, a first rib formed at the first end of the first barrel and facing a corresponding aperture, and a first groove defined at the second end of the first barrel;
        a second barrel having a first end, a second end, a protrusion formed at the first end of the second barrel and facing the corresponding aperture and a second rib formed at the second end of the second barrel and positioned in a corresponding recess;
        a resilient member having two ends fastened respectively in the first barrel and the second barrel; and
        a pin extending through the corresponding aperture and having an end, a lug and a second groove defined at the end of the pin, facing the first barrel and engaged with the first rib.

3. The waterproof cover as claimed in claim 2, wherein
    the shield has two ears formed on the inner side of the shield in the slot and individually having a hole; and
    the lugs of the pins extend respectively through the holes to pivotally mount the shield on the frame.

4. The waterproof cover as claimed in claim 2, wherein the frame has a rear side and two boards mounted on the rear side of the frame to respectively close the chambers.

5. The waterproof cover as claimed in claim 2, wherein
    the frame has a lower side and a clip mounted on the lower side of the frame, and
    the shield has a lower side and a block formed on the lower side of the shield and can be positioned in the clip.

6. The waterproof cover as claimed in claim 5, wherein the clip has a Y-like fastener and is installed on the frame.

7. The waterproof cover as claimed in claim 1, wherein the frame has a bottom side, and the inclined channels extend downwardly toward the bottom side of the frame.

* * * * *